(12) United States Patent
Hu et al.

(10) Patent No.: US 10,490,521 B2
(45) Date of Patent: Nov. 26, 2019

(54) ADVANCED STRUCTURE FOR INFO WAFER WARPAGE REDUCTION

(71) Applicant: Taiwan Semiconductor Manufacturing Company, Ltd., Hsin-Chu (TW)

(72) Inventors: Yu-Hsiang Hu, Hsin-Chu (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

(21) Appl. No.: 14/316,617

(22) Filed: Jun. 26, 2014

(65) Prior Publication Data
US 2015/0380334 A1    Dec. 31, 2015

(51) Int. Cl.
*H01L 23/00* (2006.01)
*H01L 23/36* (2006.01)
(Continued)

(52) U.S. Cl.
CPC .......... *H01L 24/14* (2013.01); *H01L 21/6835* (2013.01); *H01L 23/36* (2013.01);
(Continued)

(58) Field of Classification Search
CPC ..... H01L 24/14; H01L 21/6835; H01L 24/97; H01L 24/19; H01L 24/02; H01L 23/36;
(Continued)

(56) References Cited

U.S. PATENT DOCUMENTS

2003/0100654 A1* 5/2003 Chheang ................ C08K 3/346
524/445
2003/0114568 A1* 6/2003 Sato ....................... B82Y 30/00
524/431
(Continued)

OTHER PUBLICATIONS

Hsu, Steve Lien-Chung et al., "Synthesis and properties of polybenzoxazole-clay nanocomposites", 2002, Elsevier Science Ltd., Polymer 43, pp. 4097-4101.*
(Continued)

*Primary Examiner* — Steven H Loke
*Assistant Examiner* — Juanita B Rhodes
(74) *Attorney, Agent, or Firm* — Slater Matsil, LLP

(57) ABSTRACT

A package (e.g., a wafer level package (WLP)) including one or more redistribution layers to fan out the contact pads of the one or more dies within an integrated circuit structure. An example package includes a die having a contact pad exposed at a frontside thereof. The package also includes a redistribution layer disposed over the frontside of the die. The redistribution layer includes metallization extending through a nano-composite material, which may be formed from a dielectric material with a nano-filler material disposed therein. The metallization is electrically coupled to the contact pad of the die. By incorporating the nano-composite material in the redistribution layer, the coefficient of thermal expansion (CTE) of the redistribution layer more closely matches the CTE of the die, which prevents or eliminates undesirable warpage of the redistribution layers.

20 Claims, 16 Drawing Sheets

(51) Int. Cl.
  H01L 21/683    (2006.01)
  H01L 23/31     (2006.01)
  H01L 21/56     (2006.01)
  H01L 23/544    (2006.01)

(52) U.S. Cl.
  CPC .............. H01L 24/02 (2013.01); H01L 24/19 (2013.01); H01L 24/97 (2013.01); *H01L 21/561* (2013.01); *H01L 21/568* (2013.01); *H01L 21/6836* (2013.01); *H01L 23/3128* (2013.01); *H01L 23/544* (2013.01); *H01L 2221/68327* (2013.01); *H01L 2221/68372* (2013.01); *H01L 2223/54433* (2013.01); *H01L 2223/54486* (2013.01); *H01L 2224/0231* (2013.01); *H01L 2224/0237* (2013.01); *H01L 2224/04105* (2013.01); *H01L 2224/12105* (2013.01); *H01L 2224/13023* (2013.01); *H01L 2224/13024* (2013.01); *H01L 2224/32245* (2013.01); *H01L 2224/73267* (2013.01); *H01L 2224/94* (2013.01); *H01L 2924/06* (2013.01); *H01L 2924/0665* (2013.01); *H01L 2924/07025* (2013.01); *H01L 2924/14* (2013.01); *H01L 2924/15311* (2013.01); *H01L 2924/18162* (2013.01); *H01L 2924/3511* (2013.01)

(58) Field of Classification Search
  CPC ... H01L 2924/3511; H01L 2221/68372; H01L 2221/68327; H01L 21/6836; H01L 23/544; H01L 2924/18162; H01L 2224/94; H01L 2224/73267; H01L 2224/32245; H01L 2224/04105; H01L 2223/54486; H01L 2223/54433; H01L 23/3128; H01L 21/561; H01L 21/568; H01L 2224/12105; H01L 2924/15311; H01L 2924/14; H01L 2924/06; H01L 2924/07025; H01L 2924/0665; H01L 2224/13024; H01L 2224/13023; H01L 2224/0237; H01L 2224/0231; H01L 23/12; H01L 23/13; H01L 23/14; H01L 23/15; H01L 23/485; H01L 23/612; H01L 23/613

See application file for complete search history.

(56) References Cited

U.S. PATENT DOCUMENTS

| | | | | |
|---|---|---|---|---|
| 2003/0139513 | A1* | 7/2003 | Hsu | B29D 7/01 524/445 |
| 2005/0119371 | A1* | 6/2005 | Drzal | B82Y 30/00 523/400 |
| 2005/0151368 | A1* | 7/2005 | Heim | B42D 25/29 283/72 |
| 2007/0023886 | A1* | 2/2007 | Hedler | H01L 23/481 257/686 |
| 2007/0045589 | A1* | 3/2007 | Ittel | B22F 1/0096 252/500 |
| 2007/0155047 | A1* | 7/2007 | Jayaraman | C08G 73/12 438/106 |
| 2007/0191510 | A1* | 8/2007 | Chaiko | C08K 9/04 523/205 |
| 2007/0205520 | A1* | 9/2007 | Chou | H01L 23/3157 257/780 |
| 2007/0265379 | A1* | 11/2007 | Chen | B82Y 30/00 524/404 |
| 2010/0078806 | A1* | 4/2010 | Chakrapani | H01L 23/373 257/712 |
| 2010/0261809 | A1* | 10/2010 | Nam | C08K 3/22 523/335 |
| 2011/0278736 | A1* | 11/2011 | Lin | H01L 25/50 257/774 |
| 2011/0285005 | A1* | 11/2011 | Lin | H01L 21/4846 257/686 |
| 2012/0106111 | A1* | 5/2012 | Mazzochette | B82Y 30/00 361/783 |
| 2012/0175732 | A1* | 7/2012 | Lin | H01L 23/49816 257/531 |
| 2012/0238682 | A1* | 9/2012 | Yang | C08J 5/18 524/399 |
| 2014/0151717 | A1* | 6/2014 | Otremba | H01L 21/50 257/77 |
| 2014/0187413 | A1* | 7/2014 | Lagaron Cabello | C01B 33/38 502/62 |
| 2014/0252342 | A1* | 9/2014 | Ramadas | H01L 21/56 257/40 |
| 2014/0308527 | A1* | 10/2014 | Chun | C07F 7/0812 252/182.14 |

OTHER PUBLICATIONS

Hsu, Steve Lien-Chung et al., "Positive-Working Aqueous Base Developable Photosensitive Polybenzoxazole Precursor/Organoclay Nanocomposites", 2005, Journal of Applied Polymer Science, vol. 97, pp. 2350-2356.*

Min, Ungki, et al., "Colorless and Transparent Polyimide Nanocomposite Films Containing Organoclay", Journal of Nanoscience and Nanotechnology, vol. 11. 2011, pp. 6404-6409.*

Liu, Lizhu et al., "The Effects of Coupling Agents on the Properties of Polyimide/Nano-Al2O3 Three-Layer Hybrid Films", Hindawi Publishing Corporation, Journal of Nanomaterials, vol. 2010, pp. 1-5.*

Wong et al., "Thermal Conductivity, Elastic Modulus, and Coefficient of Thermal Expansion of Polymer Composites Filled with Ceramic Particles for Electronic Packaging", Apr. 19, 1999, Journal of Applied Polymer Science, Vo. 74, pp. 3396-3403 (Year: 1999).*

Wildner et al., "Nanofiller materials for transparent polymer composites: Influences on the properties", Sep. 18, 2018, Journal of Thermoplastic Composite Materials, pp. 1-19 (Year: 2018).*

Hsu et al., "Synthesis and properties of polybenzoxazole-clay nanocomposites", Polymer 43 (2002), pp. 4097-4101.

Lin et al., "Low Dieletric Constant Nanocomposite Thin Films Based on Silica Nanoparticle and Organic Thermosets", IBM Research Report, Materials Science, RC24069 (W0610-023), Oct. 4, 2006, 41 pages.

Sun et al., "Study and Characterization on the Nanocomposite Underfill for Flip Chip Applications", IEEE Transactions on Components and Packaging Technologies, vol. 29, No. 1, Mar. 2006, pp. 190-197.

Tan et al., "Nanofiller Dispersion in Polymer Dielectrics", Materials Sciences and Applications (MSA), 2013, pp. 6-15.

Xu, "Dielectric Nanocomposites for High Performance Embedded Capacitors in Organic Printed Circuit Boards", A Dissertation Presented to the Academic Faculty, Georgia Institute of Technology, Aug. 2006, 280 pages.

* cited by examiner

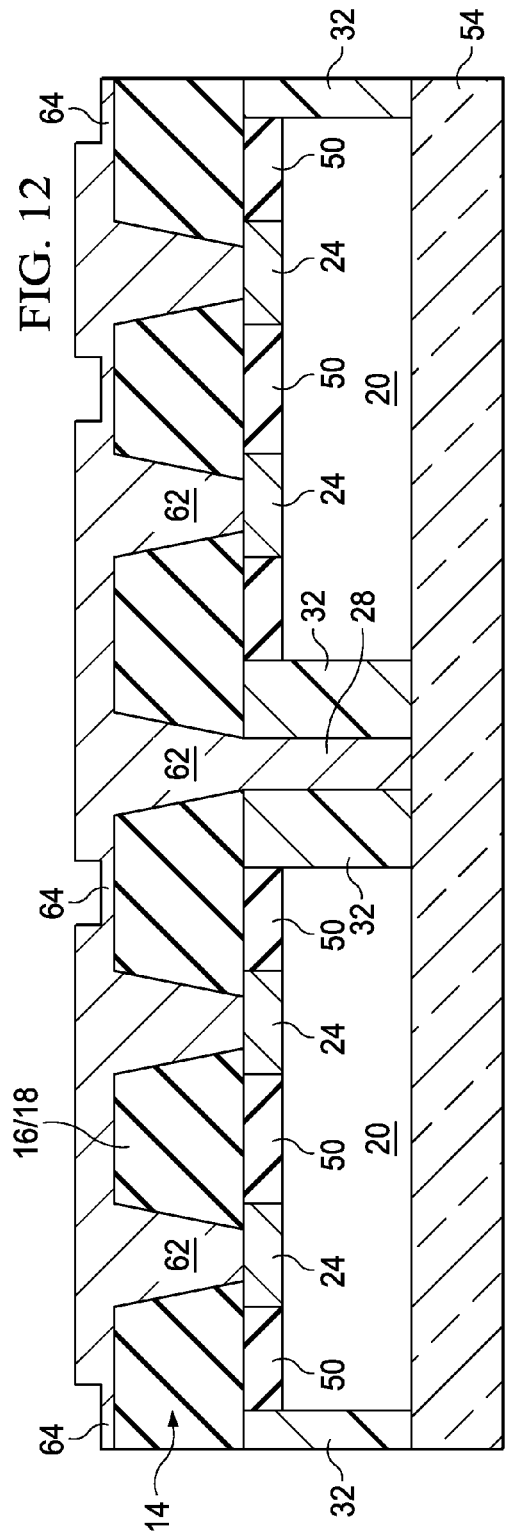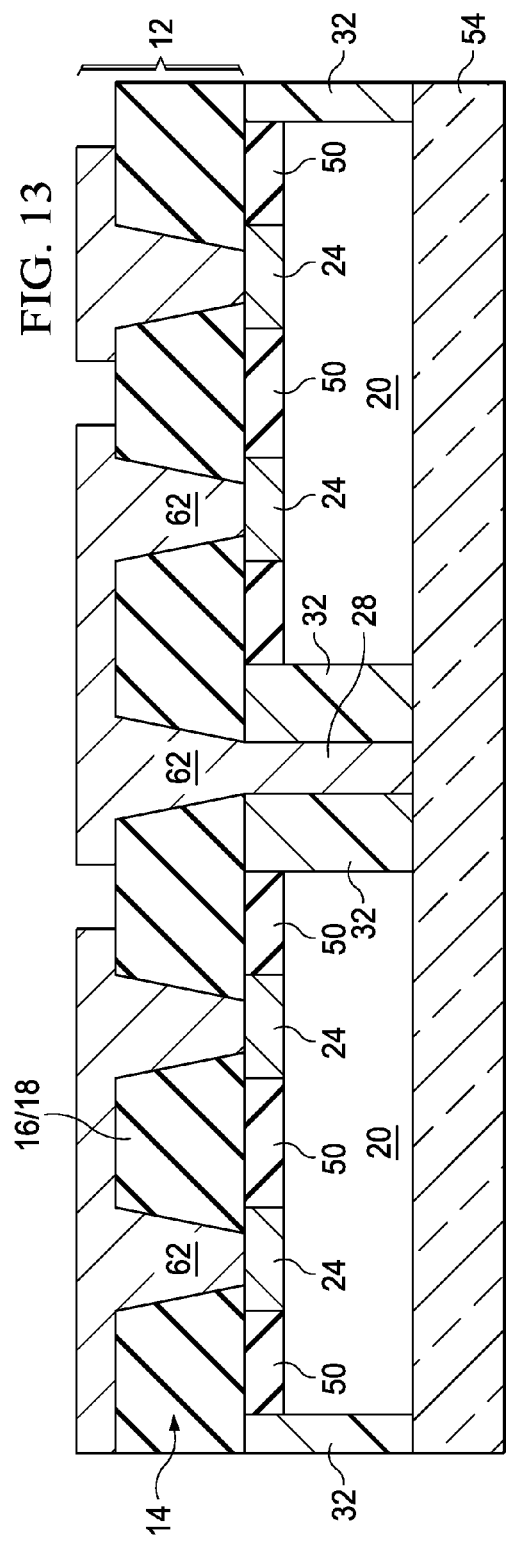

| Clay(wt%) | 0 | 1 | 3 | 5 | 7 |
|---|---|---|---|---|---|
| Transparency(II-D)$^C$ | 91 | 89.3 | 88.6 | 57.6 | 38.9 |
| CTE(II-D)$^C$ | 45.8 | 42.8 | 32.7 | 30.5 | 28.8 |
| $T_5$(II-D)$^C$ | 521 | 533 | 535 | 530 | 524 |
| Tg(II-D)$^C$ | 332 | 338 | 337 | 341 | 334 |

ADVANCED STRUCTURE FOR INFO WAFER WARPAGE REDUCTION

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller package for semiconductor devices is a wafer level package (WLP). In the after level package, integrated circuits are packaged in packages that typically include a redistribution layer (RDL) or post passivation interconnect (PPI) used to fan-out wiring for contact pads of the package so that electrical contacts can be made on a larger pitch than contact pads of the integrated circuit. The WLP is often used to package integrated circuits (ICs) demanding high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-18 collectively illustrate a process flow for producing the package of FIG. 1 in accordance with some embodiments.

DETAILED DESCRIPTION

Figure 1:
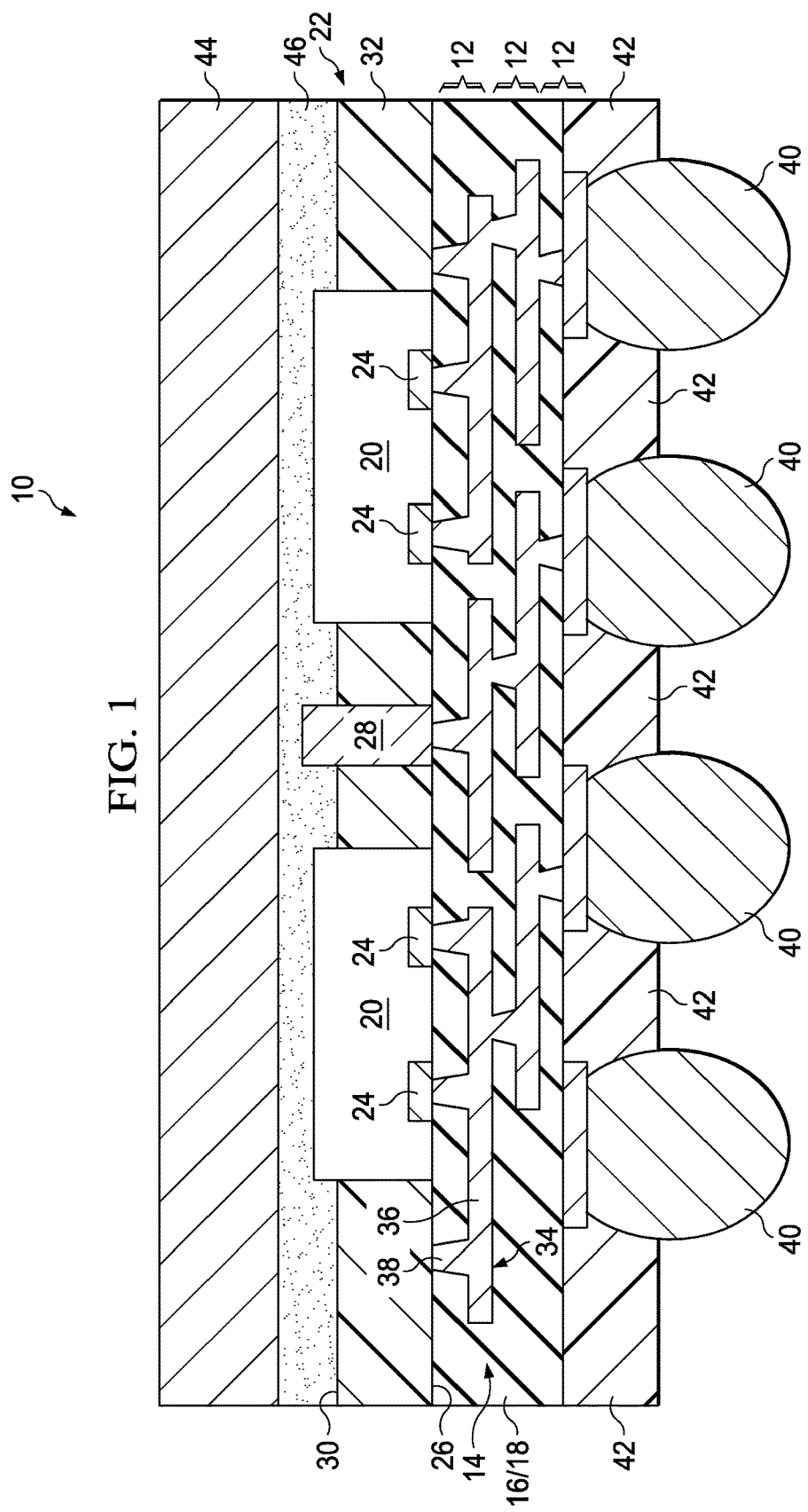
FIG. 1 illustrates a package having redistribution layers utilizing a nano-composite material in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafer-level packaging (WLP) refers to the technology of packaging an integrated circuit at wafer level, instead of the traditional process of assembling the package of each individual unit after wafer dicing. Wafer-level packaging may be referred to as a chip-scale packaging (CSP) technology because the resulting package can be the same or a similar size as the die. Further, wafer-level packaging permits integration of wafer fabrication, packaging, testing, and burn-in at the wafer level, which beneficially streamlines the manufacturing process.

In fan-out packaging, redistribution layers (RDLs) may be formed over the die in the wafer and electrically connected to the contact pads. Input/output (I/O) connectors such as solder balls may then be formed to electrically connect to the contact pads through the redistribution layers. An advantageous feature of this packaging technology is the possibility of forming fan-out packages, which means the contact pads on the die or dies can be redistributed to a greater area than the die. Therefore, the number of contact pads packed on the surfaces of the dies can be increased.

The redistribution layers noted above may contain a dielectric material (e.g., polybenzoxazole (PBO), etc.) disposed around conductive lines and vias in the various redistribution layers. The dielectric material may have a coefficient of thermal expansion (CTE) that is considerably larger than the underlying silicon in the die. By way of example, the CTE of the dielectric material in the redistribution layers may be about 80 parts per million per degree Celsius (ppm/° C.) while the CTE of the silicon in the die in the integrated circuit structure may be about 3.2 ppm/° C. Because of the difference in the CTE of the dielectric material and the silicon, the redistribution layers may be subject to undesirable or detrimental warpage. In other words, the CTE mismatch between the dielectric material and the silicon may cause the redistribution layers to warp.

Unfortunately, the warpage may more significantly impact upper redistribution layers included in the overall RDL structure. In other words, the severity of the warpage may be more pronounced on the upper or higher RDL layers relative to the warpage of the lower redistribution layers. This increase in the severity of the warpage may be the result of each successive redistribution layer warping somewhat more than the immediately underlying redistribution layer such that the entire structure is biased into a concave or convex shape. As an example of this circumstance, a third or fourth redistribution layer in the overall RDL structure may be warped more than the first and second redistribution layers.

Any warping of the redistribution layers disposed over the integrated circuit structure may lead to substantial problems. For example, if the redistribution layers have warped significantly, handling of the overall package may be difficult or impossible due to the warping. In addition, any warping of the redistribution layers disposed over the integrated circuit structure may cause lithography defocus during a lithography process use to form the redistribution layer structure, as an example. Indeed, defocus during lithography is primarily caused by or due to topography variation, lens aberration, and plane tilt.

Referring now to FIG. 1, a package 10 having redistribution layers 12 utilizing a nano-composite 14, which includes a dielectric material 16 and a nano-filler 18, in accordance with some embodiments is illustrated. As will be more fully explained below, the nano-composite 14 reduces the CTE of the redistribution layers 12. Therefore, the CTE of the redistribution layers 12 more closely matches the CTE of the silicon or other semiconductor material in dies 20 disposed in an integrated circuit structure 22. Because the CTE of the redistribution layers 12 is closer to the CTE of the silicon or other semiconductor material in the dies 20, warpage of the redistribution layers 12 is reduced or eliminated. Further, by maintaining the planar nature of the redistribution layers 12, the package 10 may be suitably handled during processing and defocus because warpage is no longer an issue during the lithography process, as examples.

As shown in FIG. 1, the package 10, which may be referred to as a wafer level package (WLP), includes dies 20 disposed in the integrated circuit structure 22. In accordance with some embodiments, one or both of the dies 20 may be a logic device or a logic component. For example, the dies 20 may be a logic integrated circuit, an analog circuit, a microprocessor, a central processing unit (CPU), a graphics processing unit (GPU), an application specific integrated circuit (ASIC), a digital signal processor (DSP), a field programmable gate array (FPGA), and the like. In accordance with some embodiments, the dies 20 may be a memory device or memory component. For example, the dies 20 may be static random access memory (SRAM), dynamic random access memory (DRAM), synchronous DRAM (SDRAM), double data rate SRAM (DDR SRAM, DDR2 SRAM, DDR3RAM), low power DRAM (LP-DRAM), reduced latency DRAM (RLDRAM), and the like.

In accordance with some embodiments, one of the dies 20 illustrated in FIG. 1 may be a logic device while the other die 20 is a memory device. In other words, the integrated circuit structure 22 may include mixed types of dies such that the package 10 contains both logic and memory. Also, while two of the dies 20 are illustrated in FIG. 1, it should be recognized that more or fewer of the dies 20 may be included in the integrated circuit structure 22. Indeed, a plurality of dies, some logic and some memory, may be disposed in the integrated circuit structure 22 in practical applications. For example, the integrated circuit structure 22 may include a single logic die 20 and several memory dies 20, several logic dies 20 and several memory dies 20, and the like. Indeed, the logic and memory may be configured in a variety of different formats using a plurality of the dies 20 in the integrated circuit structure 22.

The dies 20 include one or more contact pads 24 (e.g., input/output pads) on a frontside 26 of the integrated circuit structure 22. The contact pads 24 are formed from a conductive material such as copper (Cu), aluminum (Al), tin (Sn), nickel (Ni), gold (Au), silver (Ag), alloys thereof, and the like. The contact pads 24 are electrically connected to the circuit elements formed within semiconductor dies 20. While each of the dies 20 in FIG. 1 is illustrated having two contact pads, it should be recognized that more or fewer contact pads 24 may be included on each die 20.

In accordance with some embodiments, a through via 28 (TV) may be included in the integrated circuit structure 22. As shown, the through via 28 extends through the integrated circuit structure 22 from the frontside 26 to the back side 30 of the integrated circuit structure 22. The through via 28 is formed from a conductive material such as copper (Cu), aluminum (Al), tin (Sn), nickel (Ni), gold (Au), silver (Ag), alloys thereof, and the like. As will be more fully explained below, the through via 28 may be utilized to help dissipate the heat produced by the dies 20. In other words, the through via 28 may assist in transferring heat out of the package 10.

Still referring to FIG. 1, in accordance with some embodiments a molding material 32 is disposed around the dies 20 and/or the through via 28 in the integrated circuit structure 22. By way of example, the molding material 32 or encapsulant may comprise an epoxy-based resin, a liquid-type thermoset epoxy resin, a plastic molding compound, and the like. The molding material or molding compound formed around the dies 20 may help to protect the dies 20 from heat, shock, humidity, and corrosion.

The package 10 of FIG. 1 also includes the redistribution layers 12. While three redistribution layers 12 are depicted in FIG. 1, it should be recognized that more or fewer redistribution layers 12 may be included in the package 10 in practical applications. For example, the package 10 may include between two and four of the redistribution layers 12.

Each of the redistribution layers 12 includes metallization 34. As shown, the metallization 34 comprises various interconnected metal lines 36 and metal vias 38 extending through the various redistribution layers 12. Through the metallization 34, the redistribution layers 12 are electrically connected to the contact pads 24 of the dies 20. In accordance with some embodiments, the redistribution layers 12 fan-out or redistribute the contact pads 24 of the dies 20 to a greater area than the dies 20 occupy themselves. Therefore, the number of contact pads 24 packed on the surfaces of the dies 20 can be increased.

In accordance with some embodiments, the metallization 34 in the redistribution layers 12 is surrounded by or encapsulated within the nano-composite 14. In accordance with some embodiments, the nano-composite 14 comprises the dielectric material 16 and the nano-filler 18. In other words, the redistribution layers 12 include the dielectric material 16 having the nano-filler 18 therein. As will be more fully explained below, the nano-composite 14 permits the CTE of the redistribution layers 12 to more closely match the CTE of the silicon or semiconductor material of the dies 20, which prevents the redistribution layers 12 from warping.

In accordance with some embodiments, the dielectric material 16 of the nano-composite 14 from the redistribution layers 12 comprises a low-k, an extreme low-k, or a porous low-k dielectric material. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less.

In accordance with some embodiments, the dielectric material 16 forming part of the nano-composite 14 of the redistribution layers 12 comprises polybenzoxazole (PBO), polyimide (PI), siloxane, benzocyclobutene, epoxy (e.g., a Novolak-based epoxy), silicone, or polynorborene. In accordance with some embodiments, the dielectric material 16 comprises poly(methyl methacrylate) (PMMA), silicon dioxide ($SiO_2$), porous silicon dioxide, carbon doped oxide (CDO), carbon doped silicon dioxide, black diamond, diamond-like carbon (DLC), fluorinated diamond-like carbon, aromatic (hydrocarbon) thermosetting polymer (ATP), aromatic thermoset (SiLK), hydrogen silsesquioxane (HSQ), methyl silsesquioxane (MSQ), poly (arylene ether) (PAE), poly(p-xylylene) polymer, amorphous fluoroplastics (AF) (e.g., Teflon® AF), or Parylene of Parylene Engineering.

In addition to the above, the dielectric material 16 of the nano-composite 14 used in the redistribution layers 12 may be one of the dielectric materials commercially available under the following tradenames from the following companies: Pimel G7621 of Asahi Kasei, ALX 211 of Asahi Glass, Cyclotene 4000 of Dow Chemical, Photoneece PWDC 1000 or WL 5150 of Dow Corning, WPR or PerMX of DuPont, Durimide 7000-7500 series, AP2210A, or AN3310 of Fuji-Film, WPR 1201 or WPR 5100 of JSR, SU 8 of MicroChem Corp., Cardo VPA of Nippon Steel, Intervia 8023 of Rohm & Haas/Dow Chemical, SINR of Shin Etsu, SAP 200 of Silecs, Excel CRC 8000 or PNBn of Sumitomo Bakelite, and Photoneece BG 2400, Photoneece UR 5480, or Photoneece PW 1000 of Toray.

In accordance with some embodiments, the nano-filler 18 comprises between about one percent by weight and about ten percent by weight of the dielectric material, depending on the nano-filler and the dielectric material chosen. As will be more fully explained below, by maintaining the percentages of nano-filler and dielectric material within this range the nano-composite 14 maintains a level of transparency compatible with the photolithography process. In accordance with some embodiments, a transparency of the nano-composite 14 is between about fifty percent and about ninety percent to be compatible with the photolithography process. In accordance with some embodiments, the nano-composite 14 includes more than one of the nano-fillers 18. In other words, several different types of nano-fillers 18 may be concurrently used in the nano-composite 14.

In accordance with some embodiments, the nano-filler 18 of the nano-composite 14 from the redistribution layers 12 is an organic or inorganic material with nano-scale size (e.g., a few nanometers). By way of example, the nano-filler 18 may comprise a ceramic, clay, silicon, carbon nano-tubes, grapheme, and the like. In accordance with some embodiments, the nano-filler 18 has a shape comprising a sheet, a rod, a core-shell, or a tube.

In accordance with some embodiments, the nano-filler 18 comprises a carbon-based nano-filler such as carbon nanotubes (CNT), carbon nanotubes and polymer composites, carbon black, fishbone carbon nanofibers, nanoporous carbon, carbon-based nanofilms, and nanocrystalline diamond in an amorphous carbon matrix. In addition, the nano-filler 18 may be a carbon black in a single-wall carbon nano-tube (SWCNT) configuration, fullerenes (e.g., any molecule composed entirely of carbon, in the form of a hollow sphere, ellipsoid, tube, and many other shapes) in a multi-wall carbon nano-tube (MWCNT) configuration, graphite in nanohorn, or nanocluster in a nanowire or nanorod configuration. Further, the nano-filler 18 may be a nano-structured carbon, carbon foam, carbon aerogel, or carbon nanocrystal.

In accordance with some embodiments, the nano-filler 18 comprises a matrix-based nano-filler. For example, the nano-filler 18 may be a polymer matrix nano-filler such as a Polyhedral oligomeric silsesquioxane (POSS), rubber with clay, polyolenfin with layered clays, hydrophobic fumed silica, a polymer nano-filler matrix filled with normal fibers, a polymer/resin/textile matrix filled with carbon nanotubes, a polymer matrix filled with metal and ceramic nanoparticles, or a hydrated alumina in polymer. As another example, the nano-filler 18 may be a ceramic matrix nano-filler such as a ceramic matrix filled with nanocarbon/aquasomes, a ceramic matrix nano-filler for bone, a zirconium or aluminum-based ceramic nano-filler, or a ceramic matrix filled with nanopolymer. Further, the nano-filler 18 may also be a metal matrix filled with nanopolymer composites.

In accordance with some embodiments, the nano-filler 18 comprises a metal-based nano-filler. For example, the nano-filler 18 may be bulk nanostructured metals and powders such as titanium (Ti), titanium aluminide (Ti—Al), titanium transition metals alloy (e.g., iron (Fe), nickel (Ni), copper (Cu)), a magnesium nickel (Mg—Ni), an iron-copper-niobium-silicon-boron alloy, an iron transition metal alloy (e.g., cobalt (Co), nickel, titanium, chromium (Cr), copper, zirconium (Zr), aluminum, magnesium (Mg), or an aluminum-magnesium alloy. As another example, the nano-filler 18 may be nanopowders of nobel metals (e.g., aluminum, silver (Au), platinum (Pt), palladium (Pd)). In accordance with some embodiments, the nano-filler 18 comprises non-ferrous metals and alloys such as copper and copper alloys, nickel and nickel alloys, zinc and zinc alloys, cobalt and cobalt alloys, zirconium and zirconium alloys, noble metals, or light metals.

In accordance with some embodiments, the nano-filler 18 comprises a biological-based nano-filler. For example, the nano-filler 18 may be a protein-based material. The protein-based material may be self-assembling materials or functional protein units. In addition, the nano-filler 18 may be a peptide-based self-assembling material such as a nanostructured peptide (e.g., nano-pillars, nano-crystals, nano-rods, nano-wires, nano-tubes, nano-filaments, nano-fibers, and nano-shells). The nano-filler 18 may also be a peptide for molecular recognition such as peptides recognizing metal surfaces or carbon nanotubes. Further, the nano-filler 18 may comprise carbohydrates (e.g., crystalline cellulose), virus particles (e.g., structured materials using virus as structural components), lipids (e.g., lipid bilayers as support or template for self-assembly), deoxyribonucleic acid (DNA) (e.g., hybrid structures of DNA and protein), or composites (e.g., magnetsomes, calcium-biomolecule composites).

In accordance with some embodiments, the nano-filler 18 comprises a polymer-based nano-filler. For example, the nano-filler 18 may be a self-assembled structure such as lamellar (e.g., lamellar-within-spherical, lamellar-within-cylinder, cylinder-within-lamellar). In addition, the nano-filler 18 may be non-self-assembled structures such as dendrimers, hyperbranched polymers, polymer brushes, nanofibers, polyphosphazene, polymeric nanotubes, or nanocapsules. Other non-self-assembled structures may include porous materials such as polystyrene-block-poly(4-vinylpyridine) (PS-block-P4VP), poly(a-methylstyrene)-block-poly(2-vinylpyridine) (PMS-b-P2VP), Poly(2-vinylpyridine) (PVP), or PS-PVP hybrid nanolayers.

In accordance with some embodiments, the nano-filler 18 comprises a ceramic-based nano-filler. For example, the nano-filler 18 may be a tungsten carbide, alumina, zirconia, titania, silica, zinc oxide, silicon nitride, magnesia, ferric oxide, ceria, hydroxyapatite (HAP), yttria, silicon carbide, boron nitride, titanium carbide, amorphous silicon nitride, aluminum nitride, titanium nitride, zirconium nitride, $TiC_xN1-x$, $ZrC_xN1-x$, $MgAl_2O_4$, $Si_3N_4$—TiN, $Si_3N_4$—AlN, $Si_3N_4$—ZrN, AlN—TiN, AlN—ZrN, $Si_3N_4$—$Y_2O_3$, $Si_3N_4$—MgO, AlN—$Y_2O_3$, $ZrO_2$—Y2O3, $ZrO_2$—MgO, $ZrO_2$—$Al_2O_3$, YBa2Cu3O7-x, TiCXN1-x-Fe, and Ni.

In accordance with some embodiments, the nano-filler 18 comprises a nano-platelet-reinforced system (e.g., a nano-clay-reinforce composite, an expanded graphite-reinforced composite, or an exfoliation). By way of example, the nano-filler 18 may comprise montmorillonite, hectorite, saponite, illite, vermiculite, kaolinite, dickite, or nacrite.

In accordance with some embodiments, the nano-filler 18 comprises a polymer-inorganic particle nano-filler of metal (e.g., aluminum, iron, silver, gold, etc.), of metal oxide (ZnO, $Al_2O_3$, $CaCO_3$, $TiO_2$, etc.), of nonmetal (e.g., $SiO_2$), or other compounds (e.g., SiC). In accordance with some embodiments, the nano-filler 18 comprises a nanofiber reinforced system where the carbon nanofibers (CNF) are not concentric cylinders. In such embodiments, the length of the fiber may be varied from about 100 microns to several centimeters and the diameter may be varied from about 100-200 nanometers with an average aspect ratio greater than 100.

Still referring to FIG. 1, the package 10 may also include a plurality of solder features 40 electrically coupled to the metallization 34 in the final redistribution layer 12. In accordance with some embodiments, the solder features 40 are solder balls forming a ball grid array (BGA) and the metallization 34 upon which the BGA is mounted comprises an under bump metallization (UBM). In accordance with some embodiments, a molding material 42 is disposed between the solder features 40 and over exposed portions of the final redistribution layer 12. The molding material 42 may be, for example, a liquid molding compound (LMC) or other suitable molding compound or material.

In accordance with some embodiments, a heat spreader 44 is secured to the backside 30 of the integrated circuit structure 22 with an adhesive 46. The heat spreader 44, which may be formed from metal, is utilized to dissipate the heat generated by the dies 20. In other words, the heat spreader 46 is used to remove heat from the package 10, which prevents the dies 20 from overheating and suffering damage therefrom.

Figure 2:
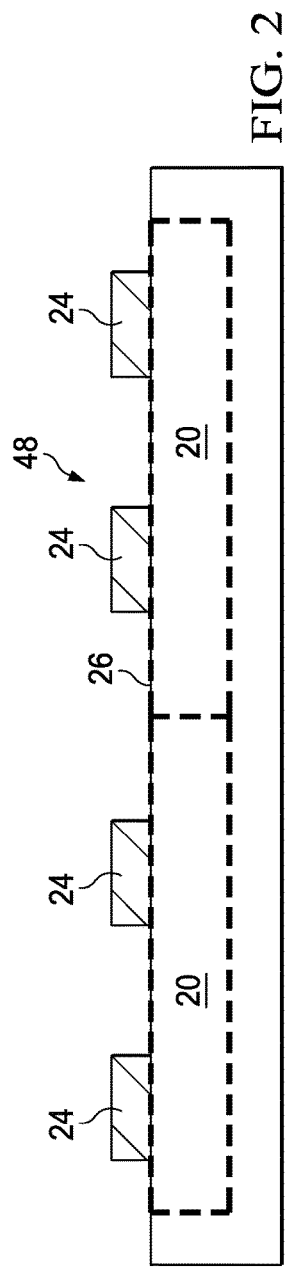
Figure 3:
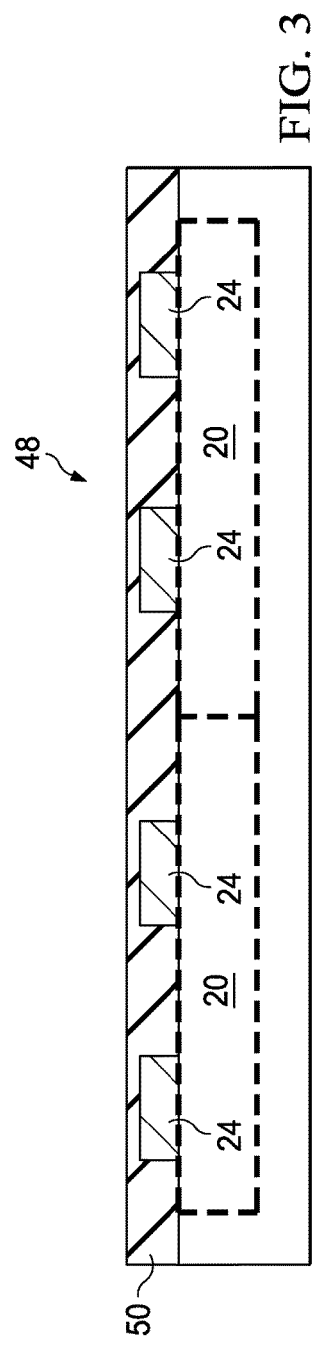
Figure 4:
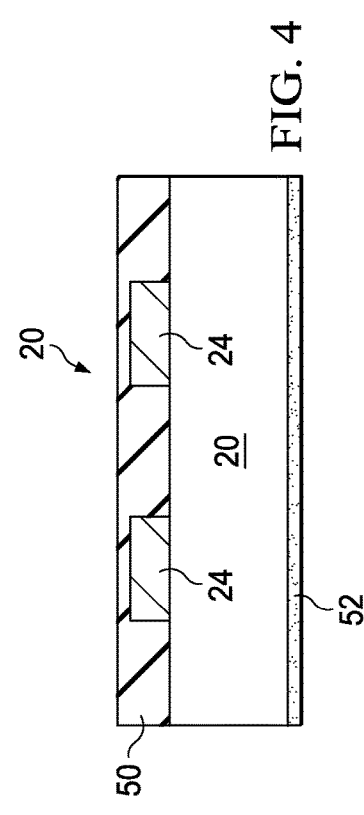

Referring to FIGS. 2-18, a process flow for producing the package 10 in accordance with some embodiments is collectively illustrated. In FIGS. 2-4, a die preparation process is depicted in accordance with some embodiments. As shown in FIG. 2, dies 20 having contact pads 24 thereon have been formed in the frontside 26 of an initial integrated circuit structure 48 (e.g., a wafer-form element or a reconstructive wafer). In FIG. 3, a dielectric layer 50 is deposited over integrated circuit structure 48. In accordance with some embodiments, the dielectric layer 50 is PBO. Next, a grinding and sawing process is performed to separate the dies 20 of FIG. 3 from each other and to generate a plurality of the dies 20 shown in FIG. 4. After the dies 20 have been sawed apart, an adhesive 52 (e.g., a die attach film (DAF), etc.) may be provided on a surface of the die 20 opposite the contact pads 24.

Figure 5:
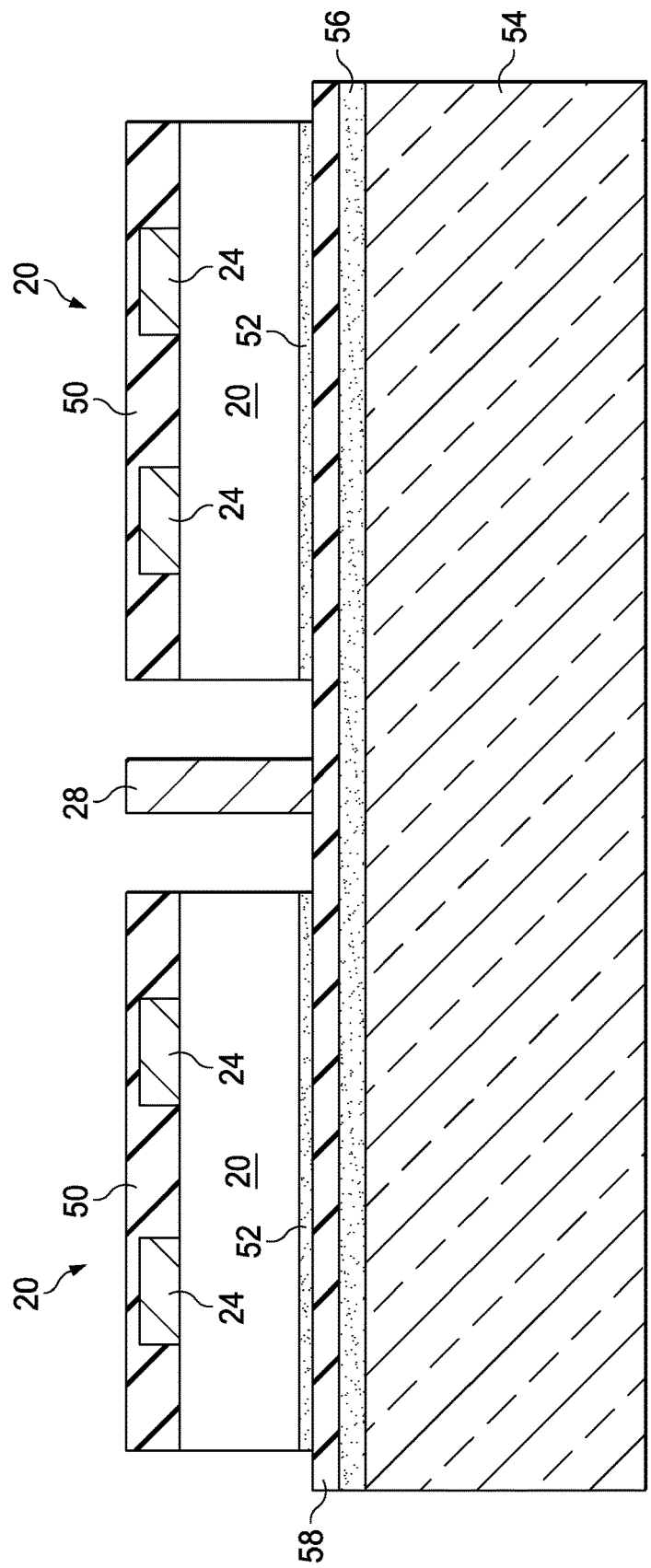

As shown in FIG. 5, a carrier 54 is provided and the dies 20 are temporarily secured thereto using the adhesive 52. In accordance with some embodiments, the carrier 54 may be formed from glass or other suitable material. In accordance with some embodiments, an adhesive layer 56 may be formed over the carrier 54 for use in temporary bonding. The adhesive layer 56 may be, for example, a light-to-heat conversion (LTHC) layer formed using a spin coating technique. In addition, in accordance with some embodiments a passivation layer 58 may be formed over the adhesive layer 56. The passivation layer 58 may also be formed using a spin coating technique. The through via (TV) 28 may be formed on the passivation layer 58 between the dies 20. The through via 28 may be used to provide electrical connection to other components and/or to help conduct heat generated by the dies 20 out of and away from the package 10.

Figure 6:
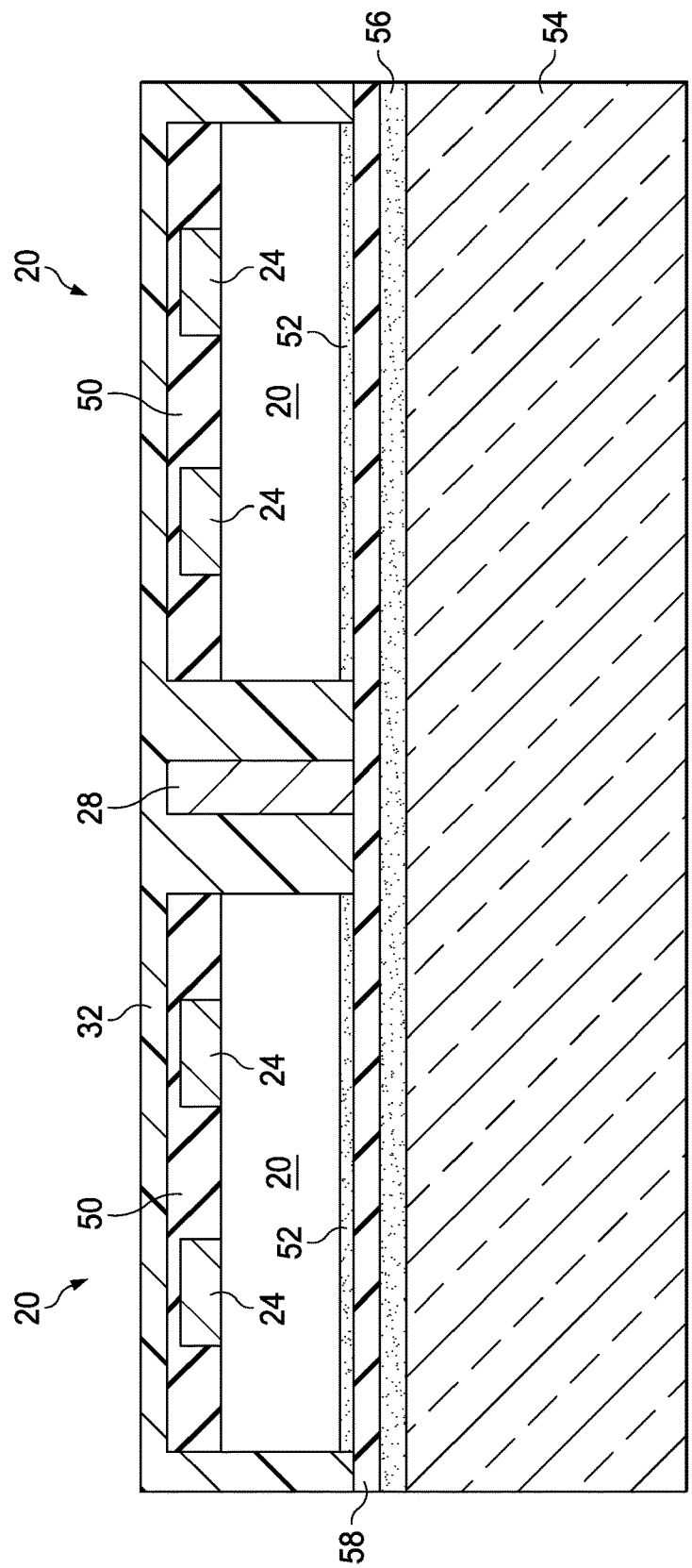
Figure 7:
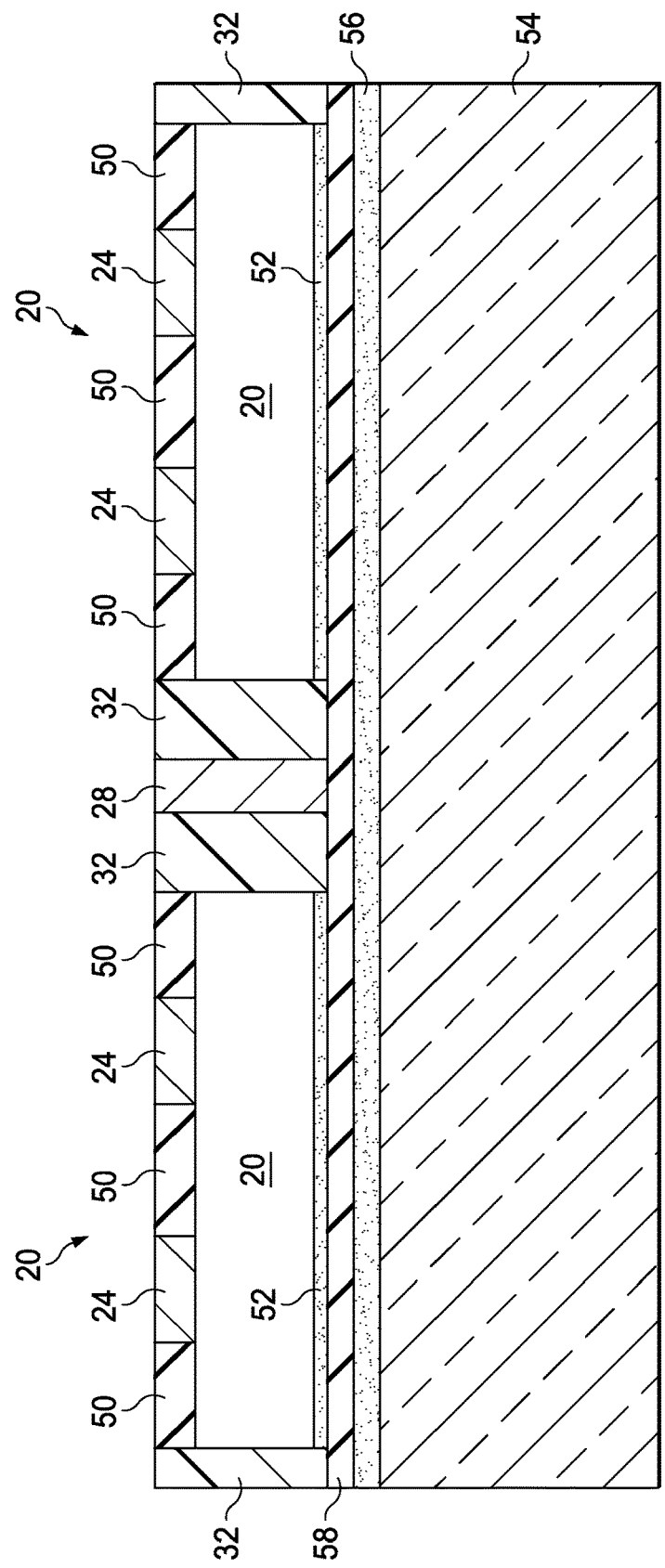

Referring now to FIG. 6, the molding material 32 is formed over and around the dies 20 and the through via 28 in accordance with some embodiments. As noted above, the molding material 32 may be an epoxy resin or other suitable molding material or compound. Next, a grinding process is performed to expose the contact pads 24 of the dies 20 and to expose the through via 28 as shown in FIG. 7.

Figure 8:
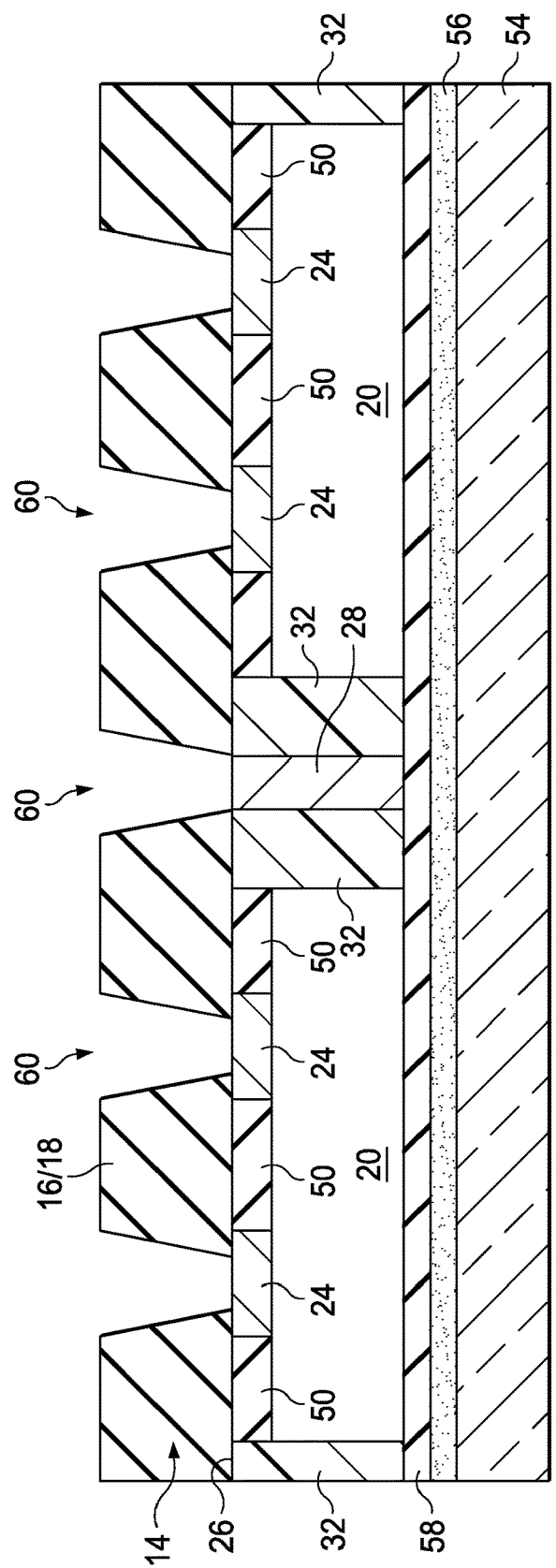

Referring now to FIG. 8, the nano-composite 14, which comprises the dielectric material 16 having nano-filler 18 disposed therein, is formed over the dies 20 and the frontside 26 of the integrated circuit structure 22. In accordance with some embodiments, the dielectric material 16 is a PBO and the nano-filler is clay.

After the nano-composite 14 is formed, openings 60 are formed in the nano-composite 14 to expose the contact pads 24 of the dies 20. In accordance with some embodiments, the openings 60 are formed using a photolithography process. During such process, the nano-composite 14 is coated with a photoresist (not shown), exposed to ultraviolet (UV) light, and then developed to remove exposed portions of the photoresist corresponding to a desired pattern for the openings 60. Once the desired pattern has been established in the photoresist, an etching process is performed to form the openings 60 in the nano-composite 14 according to the desired pattern and then the remaining photoresist is removed.

In accordance with some embodiments, the UV light in the photolithography process used to form the openings 60 has a wavelength of between about 365 nanometers and about 436 nanometers to correspond to the photoresist being exposed. In other words, UV light having the G, H, and/or I lines, or combinations thereof, may be employed. To ensure a suitable result from photolithography, the wavelength of the UV light may be tailored to the material being exposed.

Figure 9:
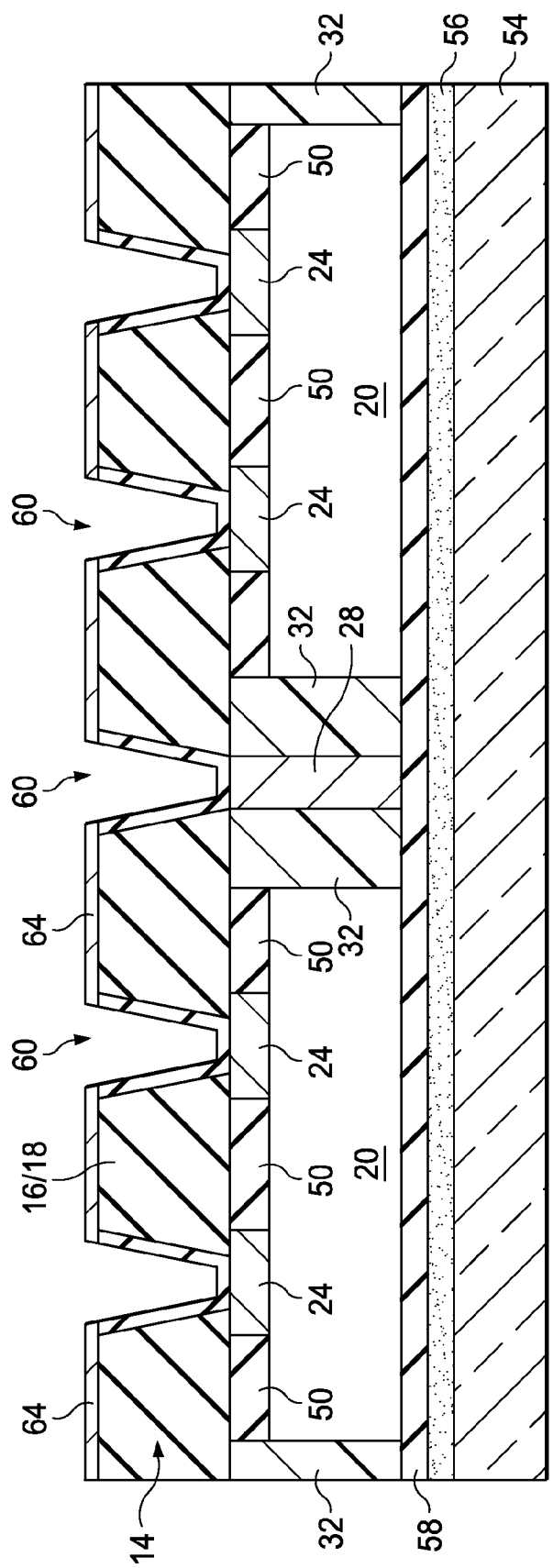
Figure 10:
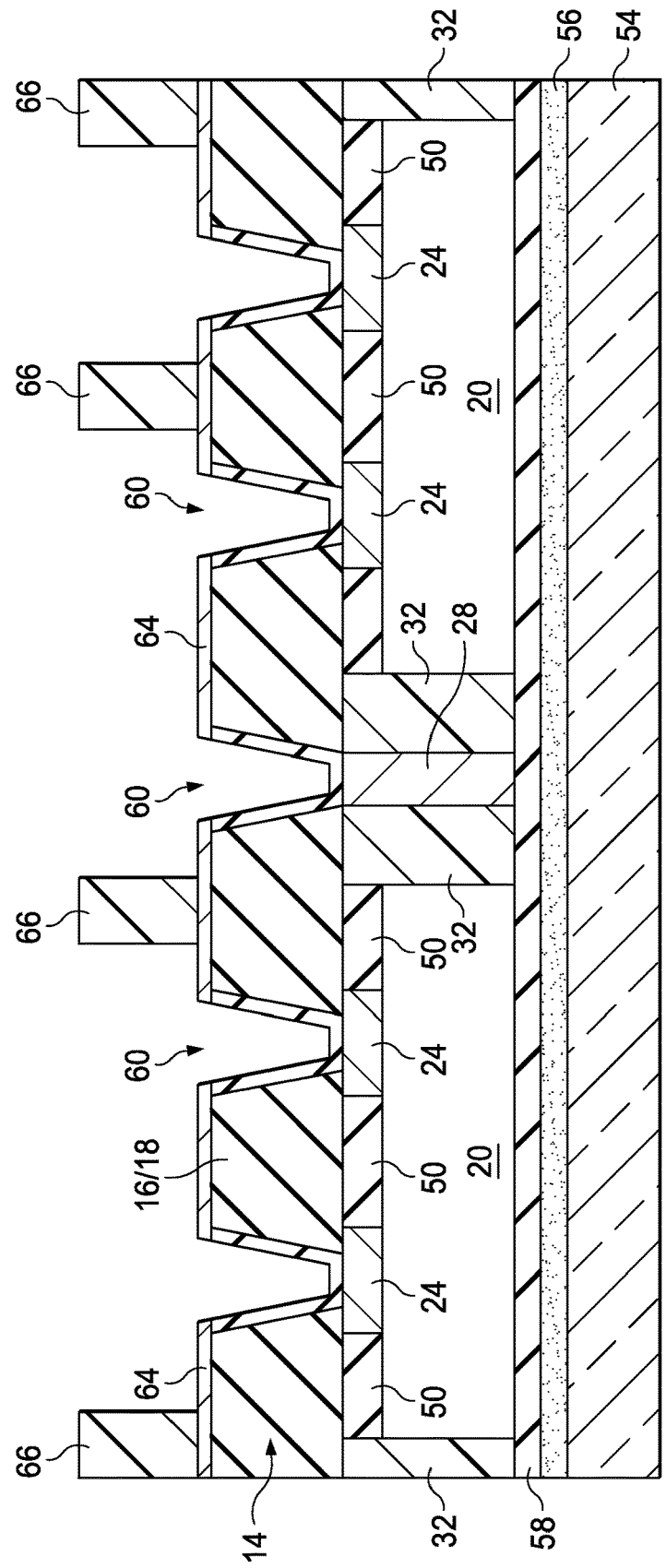
Figure 11:
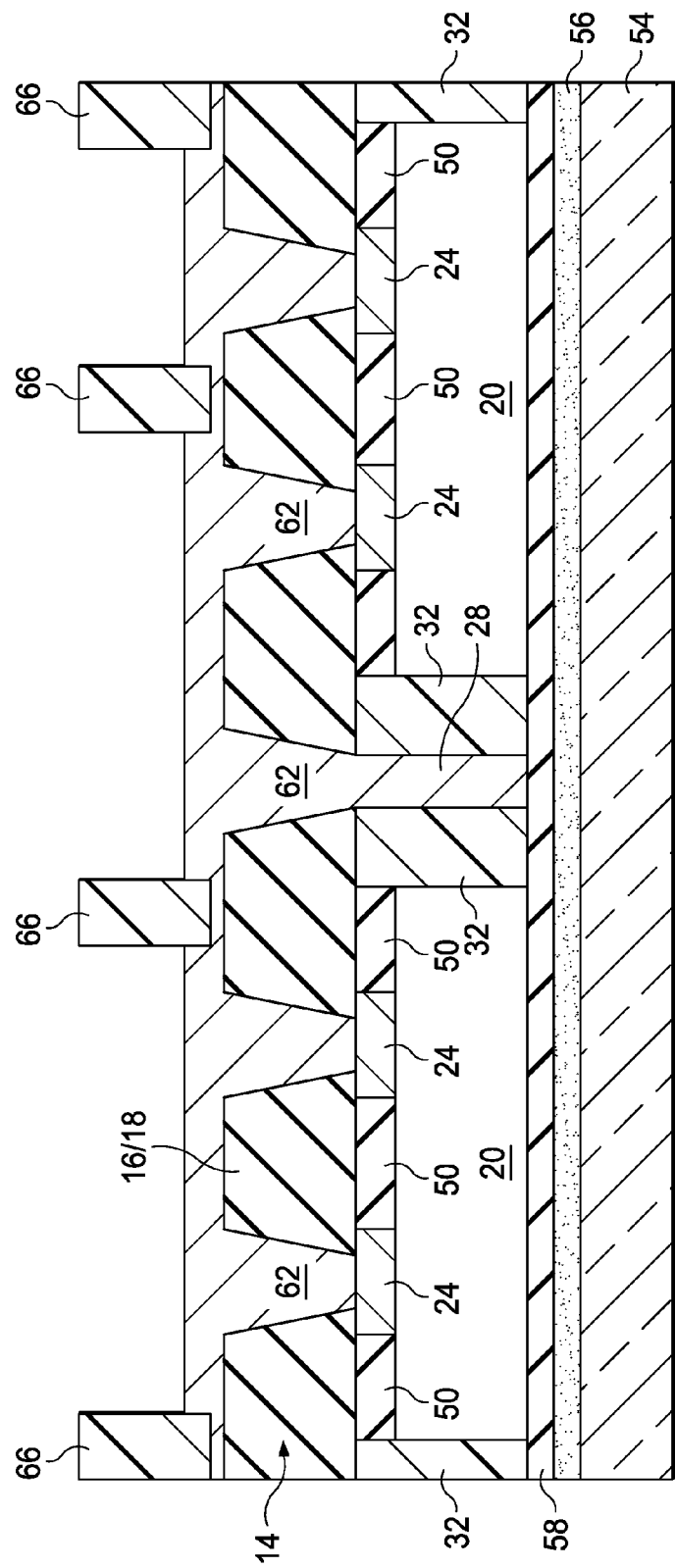

Referring collectively to FIG. 9-11, the openings 60 are filled with a conductive material 62 (e.g., copper, a copper alloy, etc.) to form the metallization 34 of FIG. 1. In accordance with some embodiments, a seed layer 64 is deposited over the nano-composite 14 as shown in FIG. 9. Thereafter, a photolithography process (as explained above) is performed to pattern the photoresist 66 as shown in FIG. 10. Next, an electroplating process is performed to fill the openings 60 with the conductive material 62 as shown in FIG. 11.

Next, as shown in FIG. 12, the photoresist 66 is removed. Upon removal of the photoresist 66, the portions of seed layer 64 that were disposed directly below the photoresist 66 are now exposed. These exposed portions of the seed layer 64 are also removed as shown in FIG. 13 to define the first redistribution layer 12.

Figure 14:
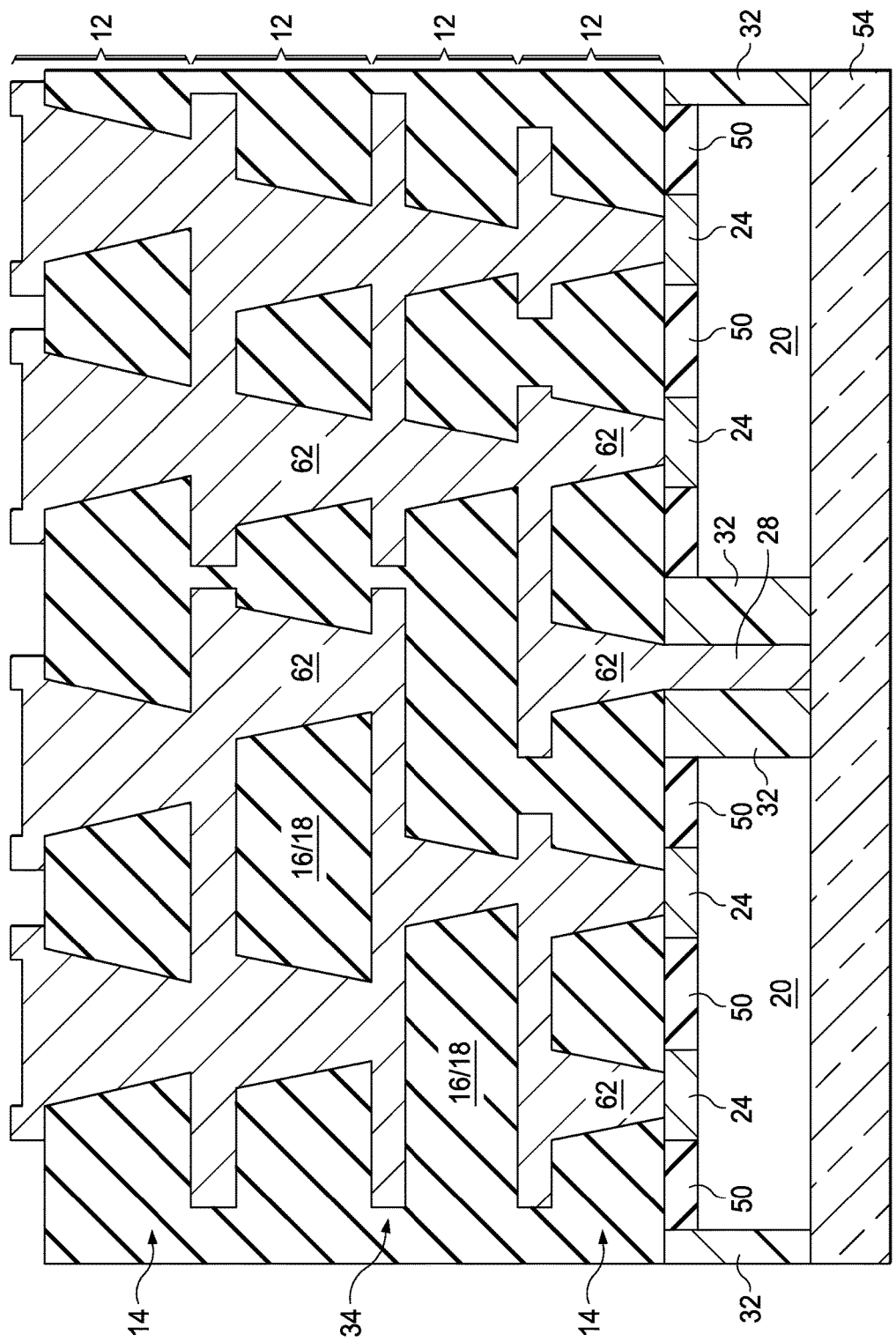

The process of forming a first or initial redistribution layer 12 as described above may be repeated to form additional redistribution layers 12. Indeed, as shown in FIG. 14 the process has been repeated to provide four of the redistribution layers 12. Notably, each redistribution layer 12 may have a different pattern for the metallization 34. In addition, one or more of the redistribution layers 12 may have different characteristics than the other redistribution layers 12. Indeed, the different redistribution layers 12 may be formed with different thicknesses, from different materials, and so on. As shown in FIG. 14, the metallization 34 in the last-formed or uppermost redistribution layer 12 is UBM.

Figure 15:
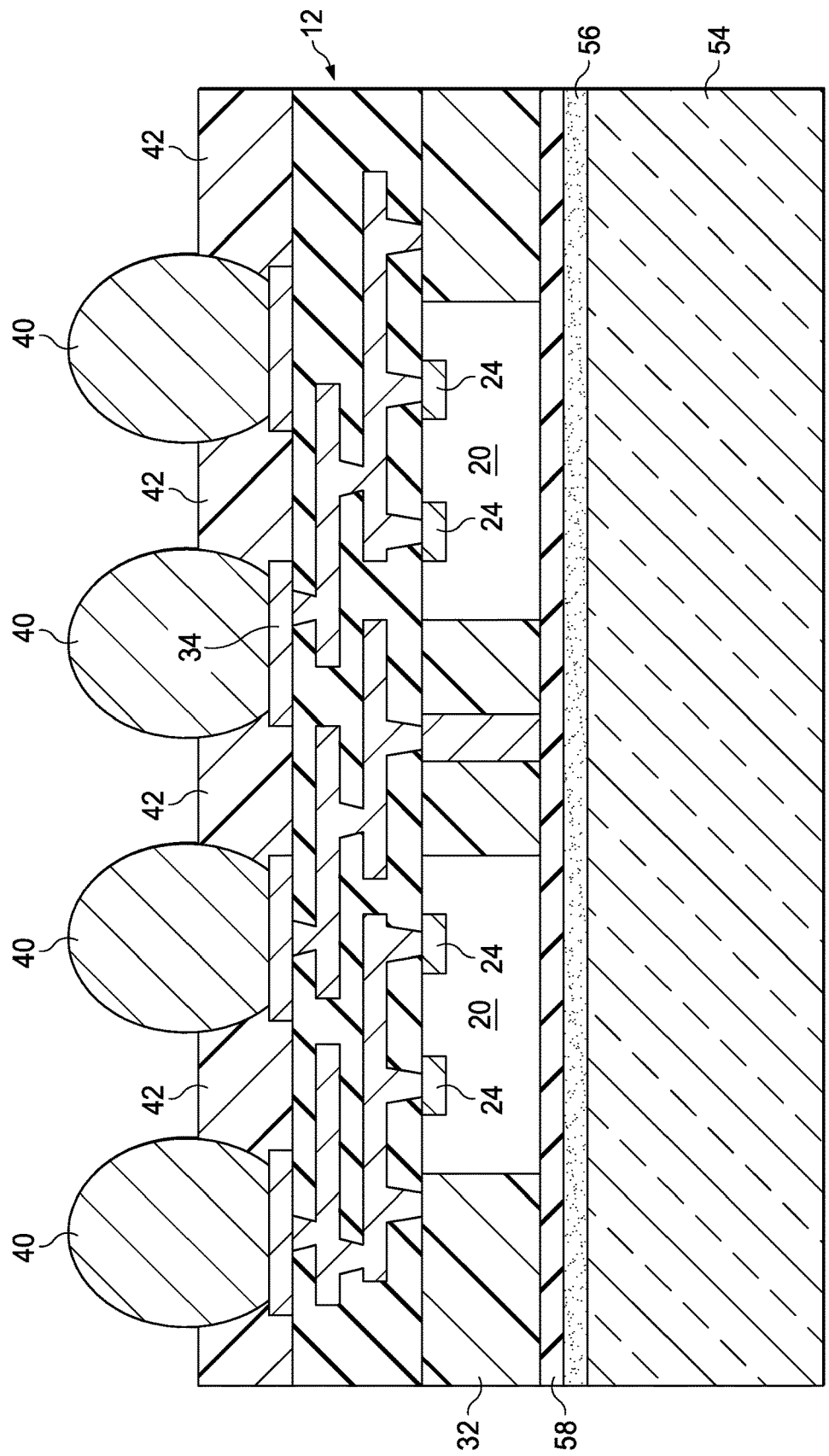

As shown in FIG. 15, which includes three of the redistribution layers 12 instead of four as shown in FIG. 14, the solder features 40 are mounted to the metallization 34 (e.g., UBM) in the last-formed redistribution layer 12 to carry the electrical signals from the contact pads 24 of the dies 20. Once the solder features 40 have been mounted, the molding material 42 is formed around the solder features 40 and over the top surface of the final redistribution layer 12.

Figure 16:
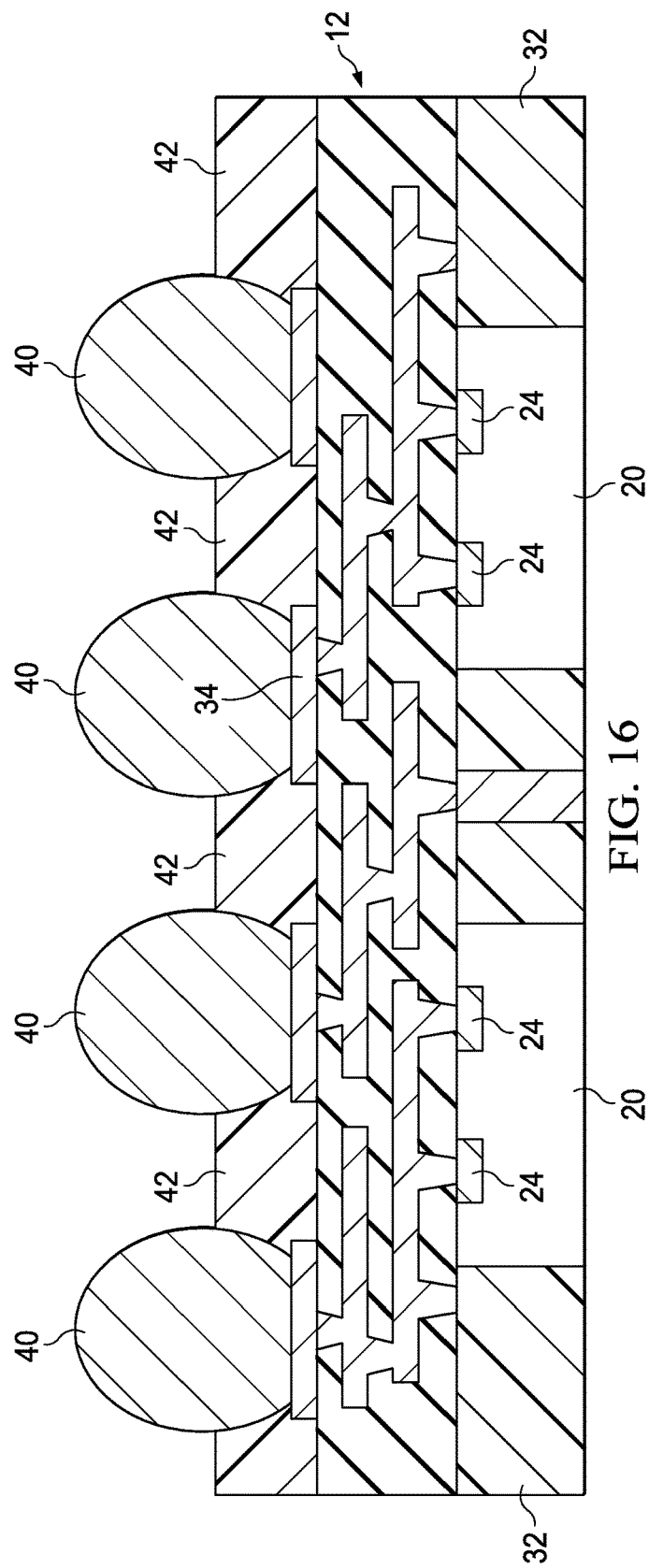
Figure 17:
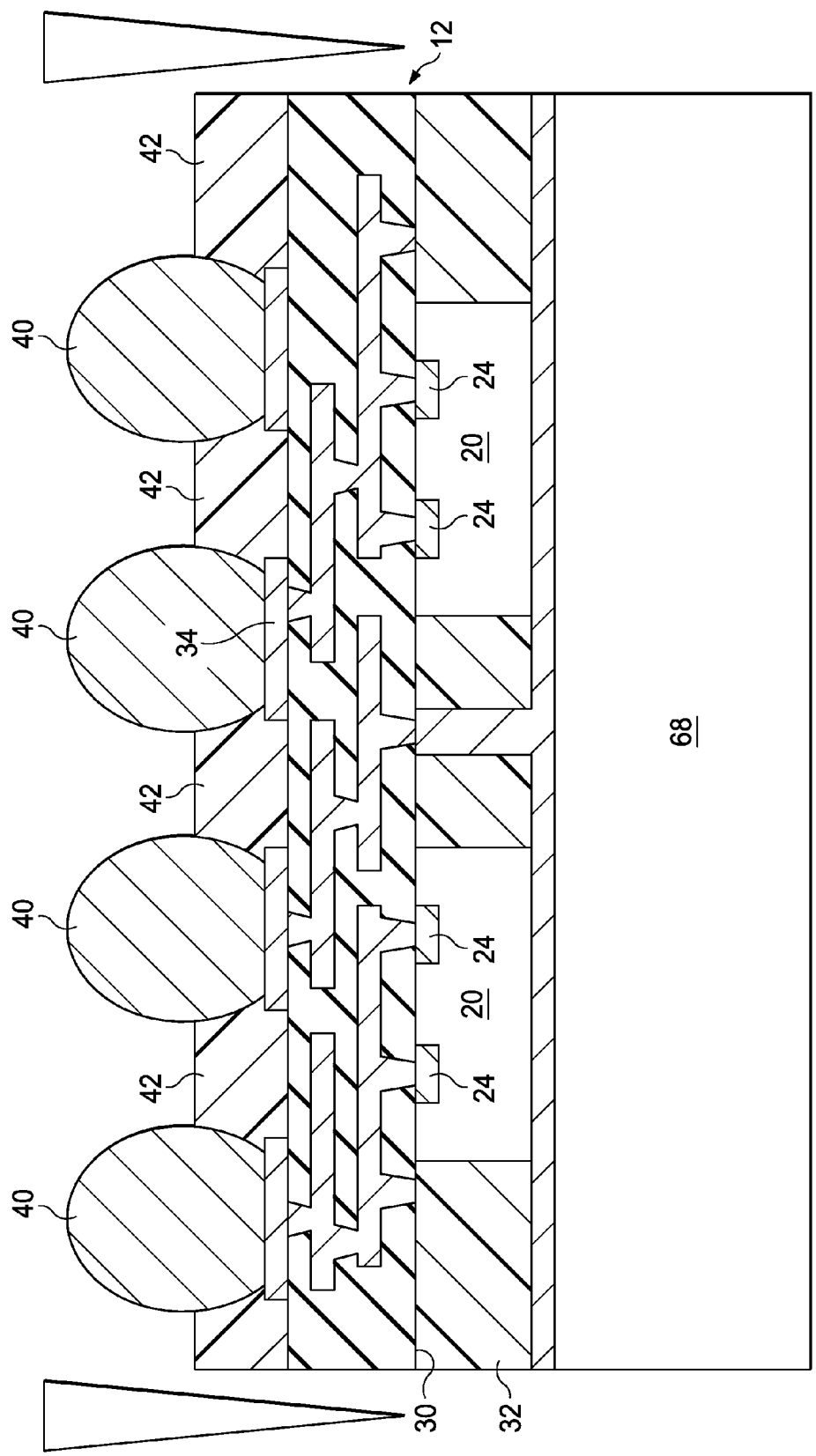

Next, as shown in FIG. 16, the carrier 54 is removed and a backside thinning process is performed. The backside thinning process removes the adhesive layer 56 and the passivation layer 58 (see FIG. 5). Thereafter, as shown in FIG. 17, a dicing tape 68 is temporarily secured to the backside 30 of the integrated circuit structure 22 and a singulation process is performed. In other words, the singulation process separates different packages from one another.

Figure 18:
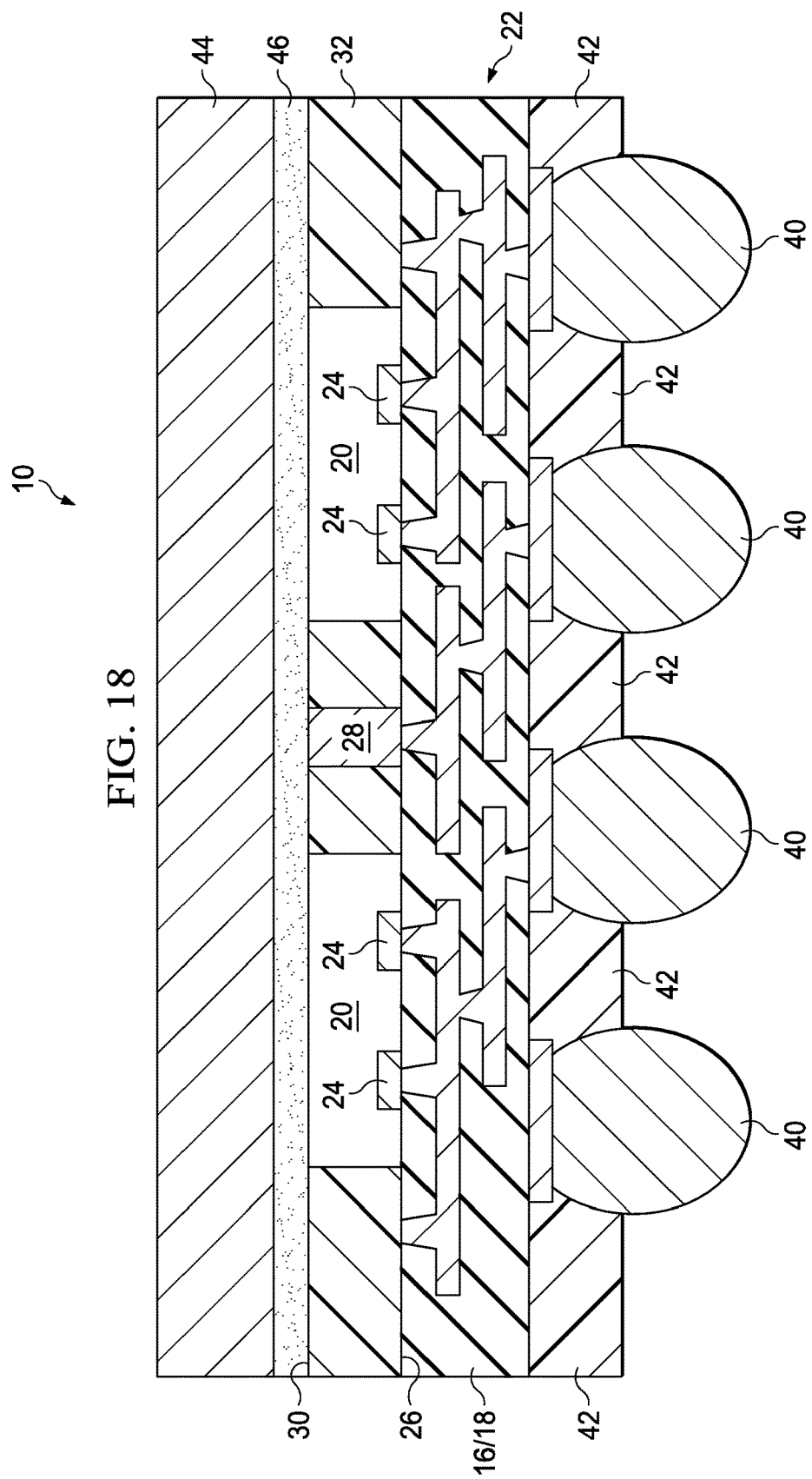

In FIG. 18, the dicing tape 68 has been removed and the heat spreader 44 is attached to the backside 30 of the integrated circuit structure 22 using the adhesive 46. As noted above, the heat spreader 44 is used to dissipate heat from the package 10. In accordance with some embodiments, a laser marking process may be performed upon the package 10 of FIG. 18 to inscribe the package 10 with, for example, the name of the package manufacturer, the package model, or other information identifying characteristics of the package 10.

Figures 19, 20:
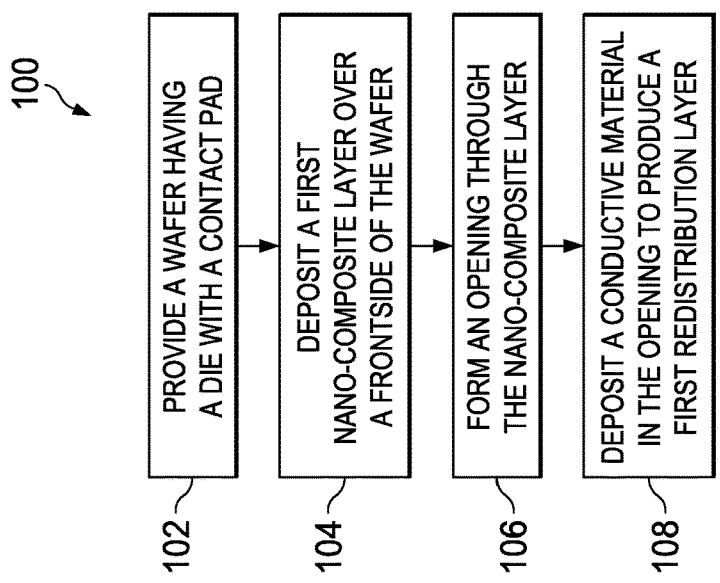
FIG. 19 illustrates a chart depicting characteristics of one of the nano-composites suitable for use in the redistribution layers of the package of FIG. 1 in accordance with some embodiments.
FIG. 20 illustrates a method of forming the package of FIG. 1 in accordance with some embodiments.

Referring now to FIG. 19, a chart 70 depicting characteristics of various nano-composites 14 formed using PBO as the dielectric material 16 and clay as the nano-filler 18 is provided. As shown, the transparency of the nano-composite 14 varied between 91 percent and 38.9 percent as the percentage of clay (by weight) in the nano-composite 14 transitioned from 0% to 7%. By way of example, when the percentage of clay was 3%, the transparency was found to be 88.6%. In accordance with some embodiments, a transparency of greater than about 50% is acceptable to ensure that the photolithography process used to form the redistribution layers 12, as described above, is effective.

The chart 70 of FIG. 19 also indicates that the CTE of the nano-composite 14 varied between 45.8 ppm and 28.8 ppm as the percentage of clay (by weight) in the nano-composite 14 transitioned from 0% to 7%. By way of example, when the percentage of clay was 3%, the CTE of the nano-composite 14 was found to be 32.7 ppm. This is much less than the CTE of PBO, which is 45.8 ppm. The drop from 45.8 ppm to 32.7 ppm represents a greater than 30% reduction in the CTE when the nano-composite having 3% by weight clay is used. Because the CTE of the nano-composite 14 used in the redistribution layers 12 is now closer to that of the silicon in the dies 20, the warpage of the redistribution layers 12 is reduced.

The chart 70 of FIG. 19 further illustrates that the degradation temperature ($T_5$) of the nano-composite 14 varied between 521° C. and 535° C. depending on the percentage of clay (by weight) in the nano-composite 14. For example, when the percentage of clay (by weight) was zero (or in other words, the dielectric material alone), the degradation temperature $T_5$ was 521° C., while the peak degradation temperature $T_5$ was 535° C. when clay was three percent (by weight), resulting in a range of about 14° C. Also, the glass transition temperature (Tg) of the nano-composite 14 varied between 341° C. and 332° C. depending on the percentage of clay (by weight) in the nano-composite 14. For example, when the percentage of clay (by weight) was zero (or in other words, the dielectric material alone), the glass transition temperature Tg was 332° C., while the peak glass transition temperature Tg was 341° C. when clay was five percent (by weight), resulting in a range of about 9° C. These relatively minor variations in temperature do not adversely impact the lithography process used to form the redistribution layers 12.

Testing of the characteristics or properties of the nano-composite 14 in the redistribution layers 12 may be performed using a variety of different techniques. For example, the nano-composite 14 may be tested using wide-angle X-ray diffraction (WAXD), small-angle X-ray scattering (SAXS), or transmission electron microscopy (TEM). The nano-composite 14 may also be tested using thermogravimetric analysis (TGA), differential scanning calorimetry (DSC), or surface micrographs (SEM).

Referring now to FIG. 20, a method 100 of forming the package 10 in accordance with some embodiments is illustrated. In block 102, an integrated circuit structure 22 having a die with a contact pad 24 is provided. In block 104, a nano-composite 14 is deposited over the frontside 26 of the integrated circuit structure 22. In block 106, an opening 60 is formed through the nano-composite 14 to expose the contact pad 24 of the die 20. In block 108, a conductive material is deposited in the opening 60 and over the contact pad 24 to produce a first redistribution layer 12.

From the foregoing, it should be recognized that the nano-composite 14 reduces the CTE of the redistribution layers 12. Therefore, the CTE of the redistribution layers 12 more closely matches the CTE of the silicon or other semiconductor material in the dies 20. Because the CTE of the redistribution layers 12 is closer to the CTE of the silicon or other semiconductor material in the dies 20, warpage of the redistribution layers 12 is reduced or eliminated. Further, by maintaining the planar nature of the redistribution layers 12, the package 10 may be suitably handled during processing and defocus due to warpage is no longer an issue during the lithography process.

A package including a die and a first redistribution layer. The die has a contact pad exposed at a frontside thereof. The first redistribution layer is disposed over the frontside of the die. The first redistribution layer includes metallization extending through a nano-composite material. The metallization is electrically coupled to the contact pad of the die.

A package a die having a contact pad and a dielectric material disposed over the die. The package also includes a nano-filler material disposed within the dielectric material and metallization extending through the dielectric material. The metallization is electrically coupled to the contact pad of the die.

A method of forming a package. The method includes providing an integrated circuit structure having a die. The die has a contact pad. The method also includes depositing a first nano-composite layer over a first surface of the integrated circuit structure and forming an opening through the nano-composite layer. The method further includes depositing a conductive material in the opening to produce a first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a die, the die having a contact pad at a frontside thereof; and
a first redistribution layer of a fan-out package disposed over the frontside of the die, the first redistribution layer including metallization extending through a nano-composite material, the metallization electrically coupled to the contact pad of the die, wherein the nano-composite material comprises a dielectric material and a nano-filler material dispersed throughout the dielectric material, wherein a transparency of the nano-composite material is between fifty percent and ninety percent, wherein the nano-filler material has a shape comprising a sheet, a rod, a core-shell, or a tube, wherein a coefficient of thermal expansion (CTE) of the nano-composite material is at least thirty percent less than a CTE of the dielectric material, and wherein the nano-composite material comprises between about three percent by weight and about seven percent by weight of the nano-filler material.

2. The package of claim 1, wherein the transparency of the nano-composite material is fifty percent.

3. The package of claim 1, wherein the dielectric material comprises polybenzoxazole (PBO).

4. The package of claim 1, wherein at least one second redistribution layer is disposed over the first redistribution layer, the at least one second redistribution layer including the nano-composite material.

5. The package of claim 1, wherein a width of the metallization is greater than a width of the die.

6. The package of claim 1, further comprising a heat spreader disposed over a backside of the die and a ball grid array is disposed over the frontside of the die, the ball grid array electrically coupled to the metallization extending through the nano-composite material.

7. A package, comprising:
a die having a frontside and a backside opposite the frontside, the die having a contact pad at the frontside thereof; a via adjacent the die;
an encapsulant surrounding the die and the via, wherein respective top surfaces of the via, the encapsulant, and the contact pad of the die are level with one another;
a dielectric material disposed over the die, the encapsulant, and the
via; a nano-filler material disposed within the dielectric material; and
a first metallization extending through the dielectric material, the metallization electrically coupled to the contact pad of the die, wherein a transparency of a composite of the dielectric material and the nano-filler material is between fifty percent and ninety percent, wherein the nano-filler material has a shape comprising a core-shell, wherein a coefficient of thermal expansion (CTE) of the dielectric material having the nano-filler material disposed therein is at least thirty percent less than a CTE of the dielectric material alone, wherein the nano-filler material disposed within the dielectric material comprises a first nano-composite having a composition, and wherein the nano-filler material disposed within the dielectric material comprises between about three percent by weight and about seven percent by weight of the dielectric material.

8. A method of forming a package, comprising:
forming an integrated circuit structure comprising:
attaching a die to a carrier, the die having a contact pad;
forming a via adjacent the die;
encapsulating the via and the die with a molding material;
grinding a first surface of the integrated circuit structure such that respective top surfaces of the molding material, the via, and the contact pad of the die are level to each other;
depositing a first nano-composite layer over the first surface of the integrated circuit structure, wherein the first nano-composite layer includes a nano-filler material, wherein the first nano-composite layer includes a dielectric material, the nano-filler material being between about one percent by weight and about seven percent by weight of the dielectric material, wherein a first coefficient of thermal expansion (CTE) of the first nano-composite layer is at least thirty percent less than a second CTE of the dielectric material, wherein a first transparency of the first nano-composite layer is greater than about fifty percent;
forming an opening through the first nano-composite layer;
depositing a conductive material in the opening to produce a first redistribution layer;
forming an adhesive on a second surface of the integrated circuit structure, the adhesive electrically isolating the via; and
attaching a heat spreader on the second surface of the integrated circuit structure with the adhesive.

9. The method of claim 8, wherein the dielectric material comprises polybenzoxazole (PBO) and the nano-filler material comprises a clay material.

10. The method of claim 8, further comprising forming at least one second nano-composite layer over the first nano-composite layer, forming a second opening through the second nano-composite layer, and depositing the conductive material in the second opening to produce a second redistribution layer.

11. The method of claim 8, wherein the first transparency is between about fifty percent and about ninety percent.

12. The package of claim 7, wherein the dielectric material comprises polybenzoxazole (PBO) and the nano-filler material comprises a clay material.

13. The package of claim 1, wherein the nano-filler material is a clay material and wherein the nano-filler material has a shape of a core-shell.

14. The package of claim 1, wherein a degradation temperature of the nano-composite material is within about fourteen degrees of a degradation temperature of the dielectric material, and wherein a glass transition temperature of the nano-composite material is within about nine degrees of a glass transition temperature of the dielectric material.

15. The package of claim 7, further comprising:
at least one second nano-composite over the first nano-composite; and
a second metallization extending through the second nano-composite.

16. The package of claim 7, further comprising:
a heat spreader disposed over the backside of the die; and a ball grid array is disposed over the frontside of the die, the ball grid array electrically coupled to the first metallization.

17. The package of claim 7, wherein a degradation temperature of the composite of the dielectric material and the nano-filler material is within about fourteen degrees of a degradation temperature of the dielectric material, and wherein a glass transition temperature of the composite of the dielectric material and the nano-filler material is within about nine degrees of a glass transition temperature of the dielectric material.

18. The package of claim 7, wherein the nano-filler material comprises a clay material.

19. The method of claim 8, wherein the nano-filler material has a shape comprising a sheet, a rod, a core-shell, or a tube.

20. The method of claim 8, wherein the nano-filler material comprises a clay material.

\* \* \* \* \*